United States Patent
Wu

(10) Patent No.: US 11,145,627 B2
(45) Date of Patent: Oct. 12, 2021

(54) SEMICONDUCTOR PACKAGE AND MANUFACTURING METHOD THEREOF

(71) Applicant: Winbond Electronics Corp., Taichung (TW)

(72) Inventor: Jin-Neng Wu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 269 days.

(21) Appl. No.: 16/592,796

(22) Filed: Oct. 4, 2019

(65) Prior Publication Data
US 2021/0104492 A1    Apr. 8, 2021

(51) Int. Cl.
| H01L 23/31 | (2006.01) |
| H01L 21/56 | (2006.01) |
| H01L 25/065 | (2006.01) |
| H01L 23/48 | (2006.01) |
| H01L 23/00 | (2006.01) |

(52) U.S. Cl.
CPC ........ *H01L 25/0657* (2013.01); *H01L 21/565* (2013.01); *H01L 23/3157* (2013.01); *H01L 23/481* (2013.01); *H01L 24/09* (2013.01); *H01L 2224/02331* (2013.01); *H01L 2224/02372* (2013.01)

(58) Field of Classification Search
CPC . H01L 21/565; H01L 23/3157; H01L 23/481; H01L 24/09; H01L 25/0657
USPC .......................................... 257/686; 438/109
See application file for complete search history.

(56) References Cited

U.S. PATENT DOCUMENTS

| 6,809,413 B1 | 10/2004 | Peterson et al. |
| 7,335,974 B2 | 2/2008 | Hwang et al. |
| 7,851,893 B2 | 12/2010 | Kim et al. |
| 8,101,460 B2 | 1/2012 | Pagaila et al. |
| 8,674,482 B2 | 3/2014 | Shi et al. |

(Continued)

FOREIGN PATENT DOCUMENTS

| TW | 201801245 | 1/2018 |
| TW | 201906116 | 2/2019 |

(Continued)

OTHER PUBLICATIONS

"Office Action of Taiwan Counterpart Application", dated May 28, 2020, p. 1-p. 8.

*Primary Examiner* — Long K Tran
(74) *Attorney, Agent, or Firm* — JCIPRNET

(57) ABSTRACT

Provided is a semiconductor package including first to third semiconductor dies, first to third RDL layers, conductive vias and an encapsulant, and a manufacturing method thereof. The first RDL layer is on an active surface of the first semiconductor die. The second semiconductor die is on the first RDL layer and electrically connected thereto through first TSVs. The conductive vias are on the first RDL layer and around the second semiconductor die. The encapsulant encapsulates the second semiconductor die and the conductive vias. The second RDL layer is on the encapsulant. The third semiconductor die is on the second RDL layer and electrically connected thereto through second TSVs. The third RDL layer is on the third semiconductor die. The area of the second semiconductor die is smaller than that of the first semiconductor die. The area of the third semiconductor die is larger than that of the second semiconductor die.

10 Claims, 7 Drawing Sheets

(56) References Cited

U.S. PATENT DOCUMENTS

| | | | |
|---|---|---|---|
| 8,742,597 B2 | 6/2014 | Nickerson et al. | |
| 8,754,514 B2 | 6/2014 | Yu et al. | |
| 8,895,440 B2 | 11/2014 | Choi et al. | |
| 9,245,852 B2 | 1/2016 | Chen et al. | |
| 9,263,394 B2 | 2/2016 | Uzoh et al. | |
| 9,385,095 B2 | 7/2016 | Jeng et al. | |
| 9,559,088 B2 | 1/2017 | Gonzalez et al. | |
| 9,698,071 B2 | 7/2017 | Wang et al. | |
| 9,728,527 B2 | 8/2017 | Uzoh et al. | |
| 10,115,678 B2 | 10/2018 | Awujoola et al. | |
| 10,157,828 B2 | 12/2018 | Hsu et al. | |
| 10,157,884 B2 | 12/2018 | Yu et al. | |
| 10,181,457 B2 | 1/2019 | Prabhu et al. | |
| 2013/0105973 A1* | 5/2013 | Gan | H01L 23/48 257/738 |
| 2019/0267351 A1* | 8/2019 | Jo | H01L 24/82 |

FOREIGN PATENT DOCUMENTS

| | | |
|---|---|---|
| TW | 201916197 | 4/2019 |
| WO | 2018182755 | 10/2018 |

\* cited by examiner

SEMICONDUCTOR PACKAGE AND MANUFACTURING METHOD THEREOF

BACKGROUND OF THE INVENTION

Field of the Invention

The invention relates to a semiconductor structure and a manufacturing method thereof, and in particular, to semiconductor package and a manufacturing method thereof.

Description of Related Art

In the technical field of semiconductor package, semiconductor package keeps developing toward a trend of an increasingly small size and multiple functions. In general semiconductor package, in order to meet a multi-function requirement, a plurality of semiconductor dies are usually required, and these dies may respectively have different functions and different areas. For example, these dies may include a logic die with a relatively large area, and a memory die and a controller die with a relatively small area, etc. In addition, these dies are disposed on an interposer and electrically connected to a printed circuit board (PCB) through the interposer. In this case, the interposer requires a relatively large size, and therefore, the semiconductor package cannot be effectively miniaturized. In addition, because an interposer is disposed in the semiconductor package, a speed at which an electrical signal is transmitted is also delayed.

SUMMARY OF THE INVENTION

The invention provides a semiconductor package, including semiconductor dies with different sizes stacked with each other and having no interposer.

The invention provides a semiconductor package manufacturing method for manufacturing the foregoing semiconductor package.

The semiconductor package of the invention includes a first semiconductor die, a first redistribution layer (RDL), a second semiconductor die, a plurality of conductive vias, an encapsulant, a second redistribution layer, a third semiconductor die, and a third redistribution layer. The first semiconductor die has an active surface and a back surface that are opposite to each other. The first redistribution layer is disposed on the active surface of the first semiconductor die and electrically connected to the first semiconductor die. The second semiconductor die has an active surface and a back surface that are opposite to each other, and is disposed on the first redistribution layer in a manner in which the active surface is oriented toward the first redistribution layer, wherein a plurality of first through-silicon vias (TSV) are disposed in the second semiconductor die, and the second semiconductor die is electrically connected to the first redistribution layer through the plurality of first through-silicon vias. The plurality of conductive vias are disposed on the first redistribution layer and located around the second semiconductor die, and are electrically connected to the first redistribution layer. The encapsulant is disposed on the first redistribution layer, and encapsulates the second semiconductor die and the plurality of conductive vias. The second redistribution layer is disposed on the encapsulant and electrically connected to the plurality of conductive vias and the plurality of first through-silicon vias in the second semiconductor die. The third semiconductor die has an active surface and a back surface that are opposite to each other, and is disposed on the second redistribution layer in a manner in which the active surface is oriented toward the second redistribution layer, wherein a plurality of second through-silicon vias are disposed in the third semiconductor die, and the third semiconductor die is electrically connected to the second redistribution layer through the plurality of second through-silicon vias. The third redistribution layer is disposed on the third semiconductor die and electrically connected to the plurality of second through-silicon vias in the third semiconductor die. At an overlooking angle from the third semiconductor die to the first semiconductor die, an area of the second semiconductor die is smaller than that of the first semiconductor die, and an area of the third semiconductor die is larger than that of the second semiconductor die.

A semiconductor package manufacturing method of the invention includes the following steps. A first semiconductor die is provided, wherein the first semiconductor die has an active surface and a back surface that are opposite to each other. A first redistribution layer is formed on the active surface of the first semiconductor die, wherein the first redistribution layer is electrically connected to the first semiconductor die. A second semiconductor die is stacked on the first redistribution layer, wherein the second semiconductor die has an active surface and a back surface that are opposite to each other, the active surface of the second semiconductor die is oriented toward the first redistribution layer, a plurality of first through-silicon vias are formed in the second semiconductor die, and the second semiconductor die is electrically connected to the first redistribution layer through the plurality of first through-silicon vias. A plurality of conductive vias are formed on the first redistribution layer, wherein the plurality of conductive vias are located around the second semiconductor die and electrically connected to the first redistribution layer. An encapsulant is formed on the first redistribution layer, wherein the encapsulant encapsulates the second semiconductor die and the plurality of conductive vias. A second redistribution layer is formed on the encapsulant, wherein the second redistribution layer is electrically connected to the plurality of conductive vias and the plurality of first through-silicon vias in the second semiconductor die. A third semiconductor die is stacked on the second redistribution layer, wherein the third semiconductor die has an active surface and a back surface that are opposite to each other, the active surface of the third semiconductor die is oriented toward the second redistribution layer, a plurality of second through-silicon vias are formed in the third semiconductor die, and the third semiconductor die is electrically connected to the second redistribution layer through the plurality of second through-silicon vias. A third redistribution layer is formed on the third semiconductor die, wherein the third redistribution layer is electrically connected to the plurality of second through-silicon vias in the third semiconductor die. At an overlooking angle from the third semiconductor die to the first semiconductor die, an area of the second semiconductor die is smaller than that of the first semiconductor die, and an area of the third semiconductor die is larger than that of the second semiconductor die.

Based on the foregoing, in the semiconductor package of the invention, elements are electrically connected to each other through the through-silicon vias, and an interposer is omitted, so that a speed at which an electrical signal is transmitted can be effectively improved. In addition, in the semiconductor package of the invention, a semiconductor die with a relatively large size and a semiconductor die with a relatively small size are alternately stacked, so that warpage caused by an uneven stress can be avoided. In addition, because an interposer is omitted and these semiconductor dies are alternately stacked, a size of the semiconductor package can be greatly reduced.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1F are schematic cross-sectional views of a semiconductor package manufacturing process according to an embodiment of the invention. First, referring to FIG. 1A, a first semiconductor die 100 having an active surface 100a and a back surface 100b that are opposite to each other is provided. The first semiconductor die 100 is a semiconductor die with a relatively large size, such as a logic die. In the present embodiment, the "size" represents an area of the semiconductor die at an overlooking angle from the active surface of the semiconductor die. Various semiconductor elements (which are not shown for clarity of the figures) are formed on the active surface 100a of the first semiconductor die 100. These semiconductor elements are, for example, a transistor, an interconnect, and a pad, etc. In the present embodiment, the semiconductor die 100 with a relatively large size may be used as a supporting substrate in a semiconductor package manufacturing process.

Figure 1A:
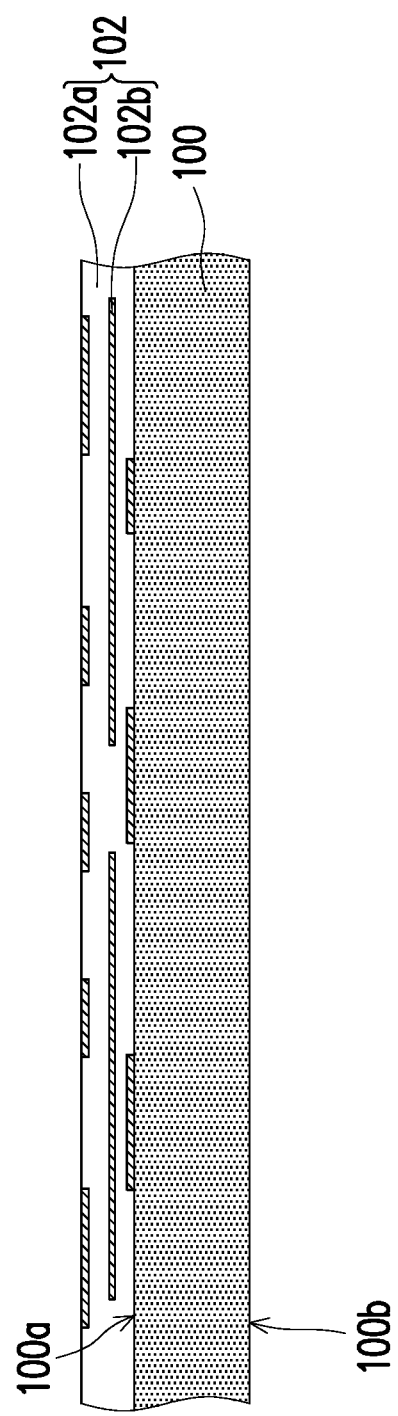
FIG. 1A to FIG. 1F are schematic cross-sectional views of a semiconductor package manufacturing process according to an embodiment of the invention.

Then, a first redistribution layer 102 is formed on the active surface 100a of the first semiconductor die 100. The first redistribution layer 102 is electrically connected to the first semiconductor die 100. The first redistribution layer 102 may include a dielectric layer 102a and a first circuit layer 102b disposed in the dielectric layer 102a. The first redistribution layer 102 may be connected to a pad of the first semiconductor die 100 through the first circuit layer 102b. In FIG. 1A, a quantity of the first circuit layer 102b of the first redistribution layer 102 is merely used as an example, and is not intended to limit the invention. A method for manufacturing the first redistribution layer 102 is well known by persons skilled in the art, and therefore the descriptions thereof are omitted herein.

Figure 1B:
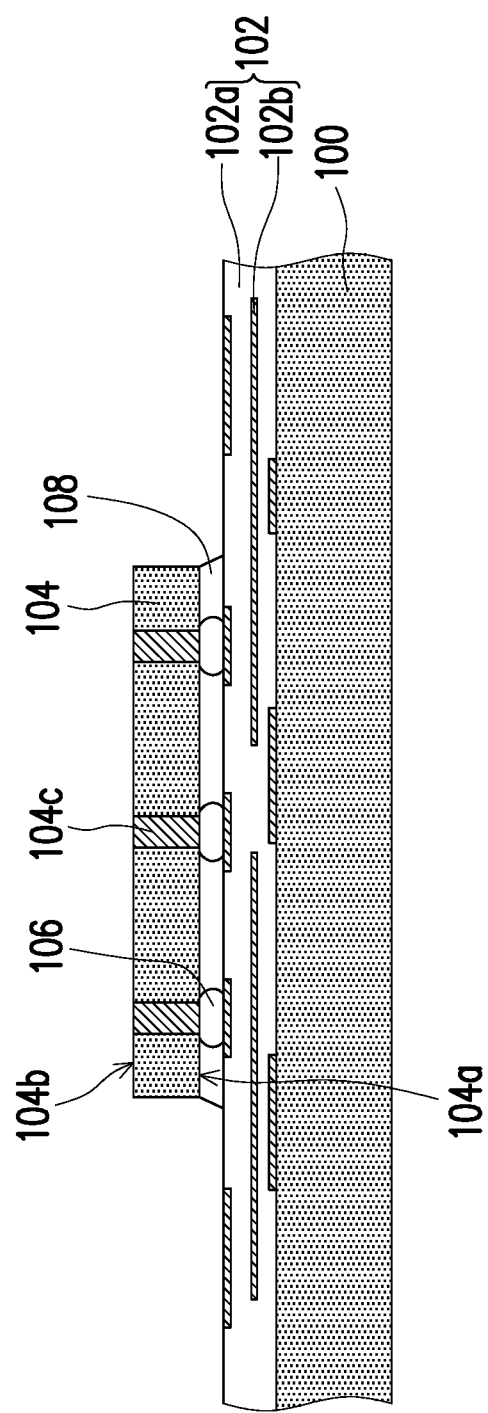

Then, referring to FIG. 1B, a second semiconductor die 104 having an active surface 104a and a back surface 104b that are opposite to each other is stacked on the first redistribution layer 102. The second semiconductor die 104 is a semiconductor die with a relatively small size, such as a memory die or a controller die. Various semiconductor elements (which are not shown for clarity of the figures) are formed on the active surface 104a of the second semiconductor die 104. These semiconductor elements are, for example, a transistor, an interconnect, and a pad, etc. A first through-silicon via 104c is formed in the second semiconductor die 104, and penetrates through the second semiconductor die 104. In the present embodiment, the second semiconductor die 104 is disposed on the first redistribution layer 102 in a manner in which the active surface 104a is oriented toward the first redistribution layer 102 (that is, in a flip die manner), and is electrically connected to the first redistribution layer 102. In the present embodiment, the second semiconductor die 104 is connected to the first circuit layer 102b of the first redistribution layer 102 through the first through-silicon via 104c and a bump 106 located outside, but the invention is not limited thereto. In another embodiment, the second semiconductor die 104 may be connected to the first circuit layer 102b of the first redistribution layer 102 through other external connecting members. In addition, in the present embodiment, an underfill 108 may be optionally formed between the second semiconductor die 104 and the first redistribution layer 102 to protect the bump 106 between the second semiconductor die 104 and the first redistribution layer 102.

Figure 1C:
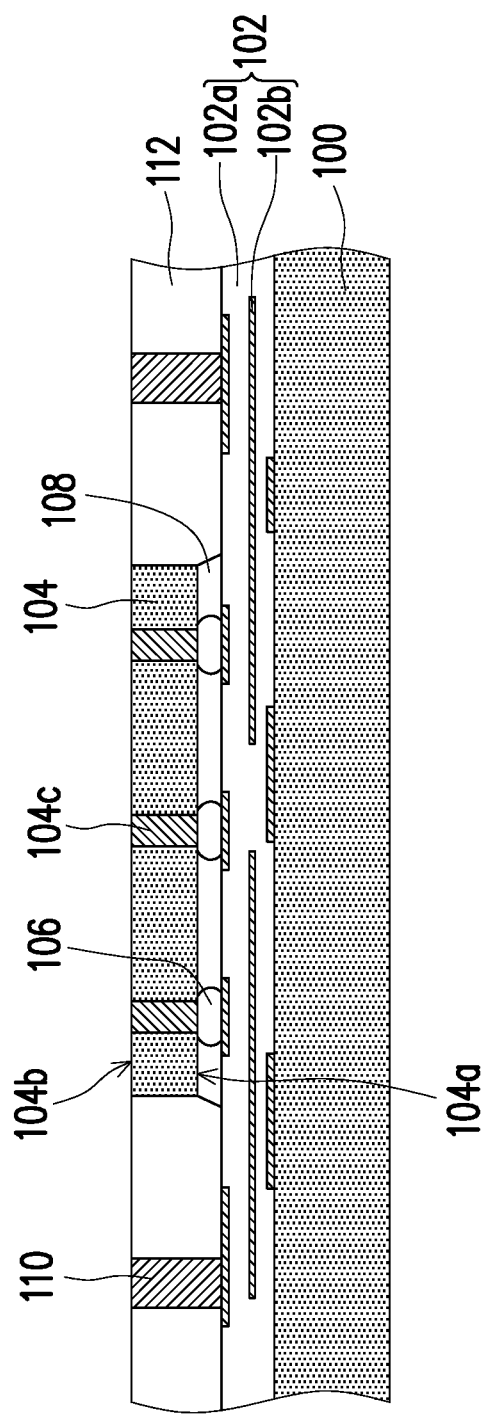

Then, referring to FIG. 1C, a plurality of conductive vias 110 are formed on the first redistribution layer 102. The conductive vias 110 are located around the second semiconductor die 104 and electrically connected to the first redistribution layer 102. For example, the conductive via 110 is a copper conductive column. A forming method thereof is well known by persons skilled in the art, and therefore the descriptions thereof are omitted herein. In the present embodiment, the conductive vias 110 surround the second semiconductor die 104, and are respectively connected to the first circuit layer 102b of the first redistribution layer 102. A top surface of the conductive vias 110 and the back surface 104b of the second semiconductor die 104 may be coplanar, or the top surface of the conductive vias 110 may be higher than the back surface 104b of the second semiconductor die 104. This is not limited in the invention. Then, an encapsulant 112 is formed on the first redistribution layer 102. The encapsulant 112 encapsulates the second semiconductor die 104 and the conductive vias 110.

In the present embodiment, the encapsulant 112 is formed through a molding process, so that the encapsulant 112 encapsulates a side wall of the second semiconductor die 104 and a side wall of the conductive vias 110 and exposes the back surface 104b of the second semiconductor die 104 and the top surface of the conductive vias 110. However, the invention is not limited thereto. In another embodiment, the encapsulant 112 is formed through a molding process, so that the encapsulant 112 encapsulates the entire second semiconductor die 104 and the entire conductive vias 110. Subsequently, a grinding process is performed to remove a portion of the encapsulant 112 (if the top surface of the conductive vias 110 is higher than the back surface 104b of the second semiconductor die 104, a portion of the conductive vias 110 is also removed), until the back surface 104b of the second semiconductor die 104 and the top surface of the conductive vias 110 are exposed. In this way, the back surface 104b of the second semiconductor die 104, the top surface of the conductive vias 110, and the top surface of the encapsulant 112 are coplanar, so that other elements can be firmly disposed thereon.

Figure 1D:
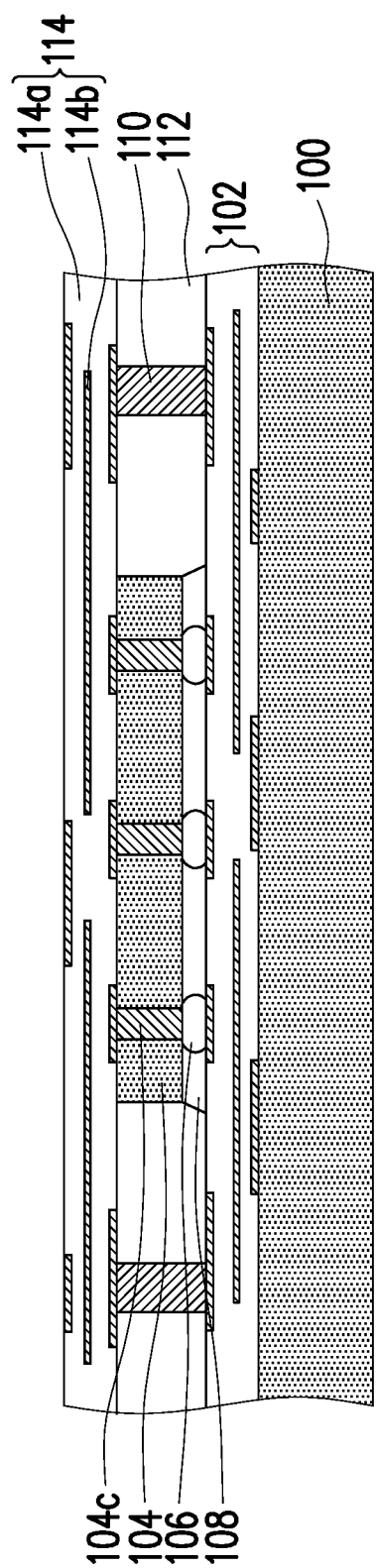

Then, referring to FIG. 1D, a second redistribution layer 114 is formed on the encapsulant 112. The second redistribution layer 114 is electrically connected to the conductive vias 110 and the first through-silicon via 104c in the second semiconductor die 104. The second redistribution layer 114 may include a dielectric layer 114a and a second circuit layer 114b disposed in the dielectric layer 114a. The second redistribution layer 114 may be connected to the conductive vias 110 and the first through-silicon via 104c in the second semiconductor die 104 through the second circuit layer 114b. In FIG. 1D, a quantity of the second circuit layer 114b of the second redistribution layer 114 is merely used as an example, and is not intended to limit the invention. A method for manufacturing the second redistribution layer 114 is well known by persons skilled in the art, and therefore the descriptions thereof are omitted herein. In the present embodiment, the back surface 104b of the second semiconductor die 104, the top surface of the conductive vias 110, and the top surface of the encapsulant 112 are coplanar, so that the second redistribution layer 114 can be firmly disposed thereon.

Figure 1E:
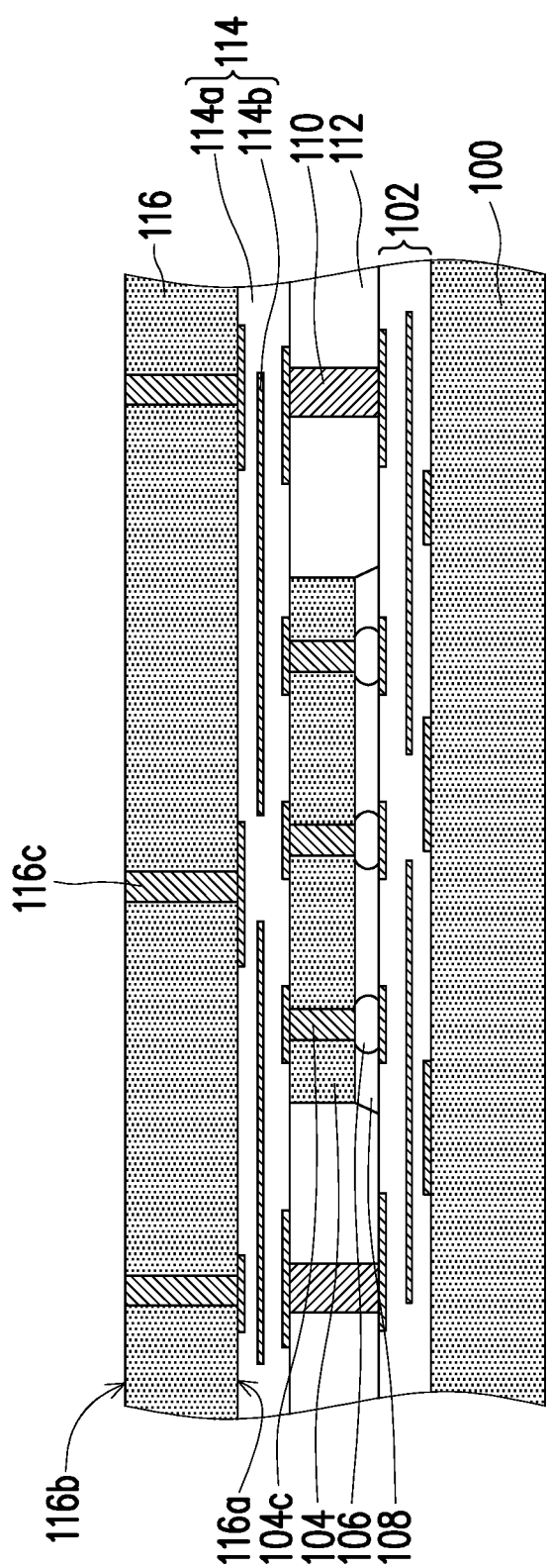

Then, referring to FIG. 1E, a third semiconductor die 116 having an active surface 116a and a back surface 116b that are opposite to each other is stacked on the second redistribution layer 114. The third semiconductor die 116 is a semiconductor die with a relatively large size, such as a logic die. The third semiconductor die 116 may be the same as or different from the first semiconductor die 100. This is not limited in the invention. In addition, in the present embodiment, the third semiconductor die 116 may have a size the same as that of the first semiconductor die 100, but the invention is not limited thereto. In another embodiment, the third semiconductor die 116 may have a size different from that of the first semiconductor die 100, as long as the size of the third semiconductor die 116 is larger than that of the second semiconductor die 104.

Various semiconductor elements (which are not shown for clarity of the figures) are formed on the active surface 116a of the third semiconductor die 116. These semiconductor elements are, for example, a transistor, an interconnect, and a pad, etc. A second through-silicon via 116c is formed in the third semiconductor die 116 and penetrates through the third semiconductor die 116. In the present embodiment, the third semiconductor die 116 is disposed on the second redistribution layer 114 in a manner in which the active surface 116a is oriented toward the second redistribution layer 114 (that is, in a flip die manner), and is electrically connected to the second redistribution layer 114. In the present embodiment, the third semiconductor die 116 is connected to the second circuit layer 114b of the second redistribution layer 114 through the second through-silicon via 116c.

Figure 1F:
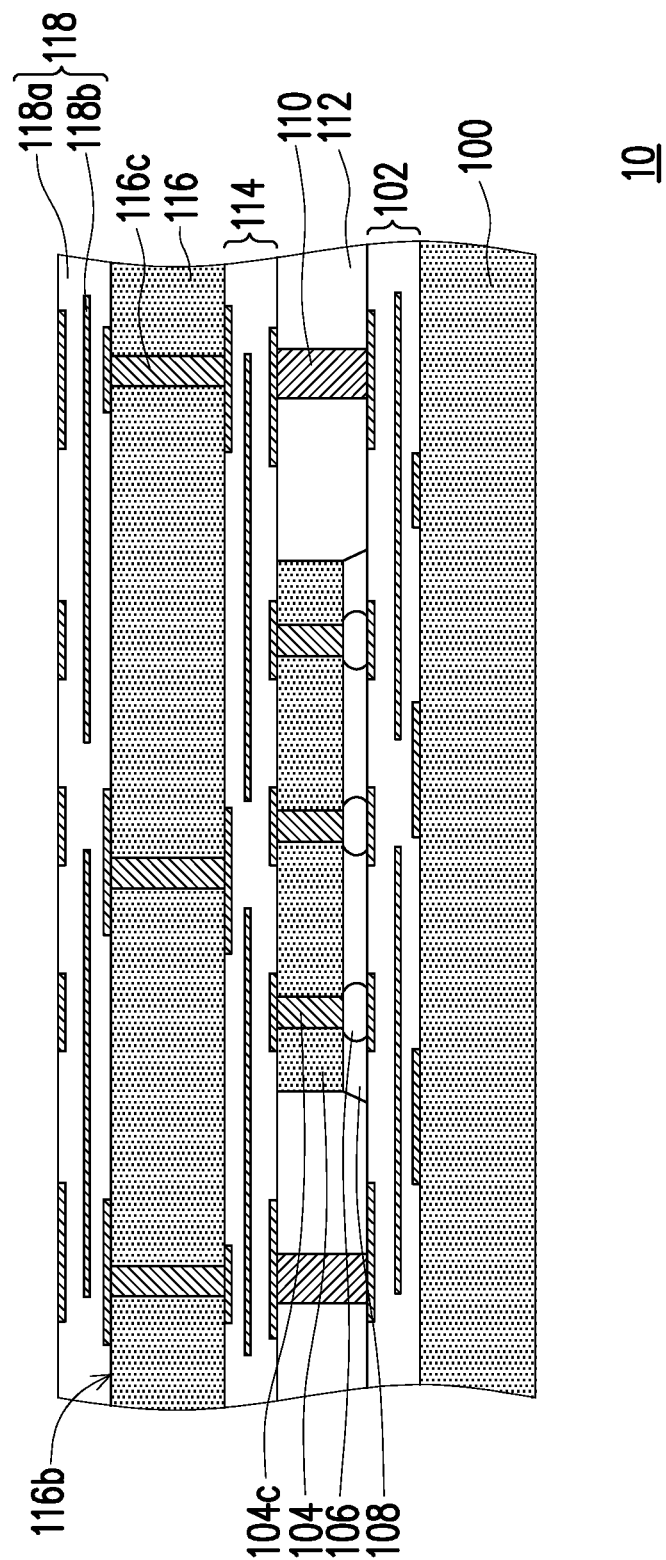

Then, referring to FIG. 1F, a third redistribution layer 118 is formed on the third semiconductor die 116, to form a semiconductor package 10 of the present embodiment. The third redistribution layer 118 is electrically connected to the second through-silicon via 116c in the third semiconductor die 116. The third redistribution layer 118 may include a dielectric layer 118a and a third circuit layer 118b disposed in the dielectric layer 118a. The third redistribution layer 118 may be connected to the second through-silicon via 116c in the third semiconductor die 116 through the third circuit layer 118b. In FIG. 1F, a quantity of the third circuit layer 118b of the third redistribution layer 118 is merely used as an example, but is not intended to limit the invention. A method for manufacturing the third redistribution layer 118 is well known by persons skilled in the art, and therefore the descriptions thereof are omitted herein.

In the semiconductor package 10 of the present embodiment, two semiconductor dies (the first semiconductor die 100 and the third semiconductor die 116) with a relatively large size and a semiconductor die (the second semiconductor die 104) with a relatively small size are alternately stacked, but the invention is not limited thereto. In another embodiment, after the semiconductor package 10 is formed, the steps in FIG. 1B to FIG. 1F may continue to be performed one or more times according to an actual requirement, so that more semiconductor dies with a relatively large size and semiconductor dies with a relatively small size are alternately stacked on the first semiconductor die 100.

After the semiconductor package 10 of the present embodiment is formed, a plurality of solder balls 120 electrically connected to the third redistribution layer 118 may be further formed on the third redistribution layer 118.

Figure 2:
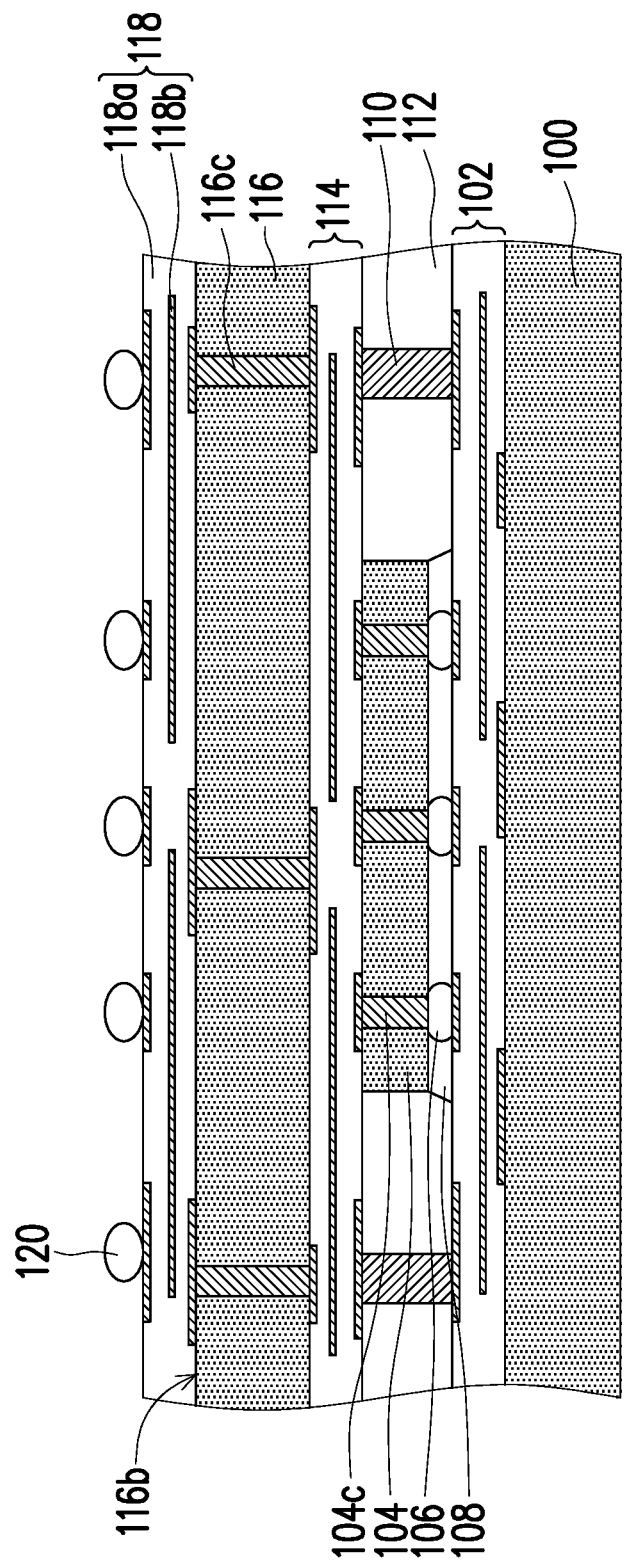
FIG. 2 is a schematic cross-sectional view of semiconductor package according to another embodiment of the invention.

FIG. 2 is a schematic cross-sectional view of a semiconductor package according to another embodiment of the invention. Referring to FIG. 2, solder balls 120 are formed on the third redistribution layer 118. The solder balls 120 are connected to the third circuit layer 118b of the third redistribution layer 118. Thus, the semiconductor package 10 can be electrically connected to an external member (for example, a printed circuit board) through the solder balls 120.

The semiconductor package of the invention is described below using the semiconductor package 10 as an example. The semiconductor package 10 includes a first semiconductor die 100, a first redistribution layer 102, a second semiconductor die 104, a plurality of conductive vias 110, an encapsulant 112, a second redistribution layer 114, a third semiconductor die 116, and a third redistribution layer 118. The first redistribution layer 102 is disposed on an active surface 100a of the first semiconductor die 100 and electrically connected to the first semiconductor die 100. The second semiconductor die 104 is disposed on the first redistribution layer 102 in a manner in which an active surface 104a is oriented toward the first redistribution layer 102, and the second semiconductor die 104 is electrically connected to the first redistribution layer 102 through a first through-silicon via 104c. The conductive vias 110 are disposed on the first redistribution layer 102 and located around the second semiconductor die 104, and are electrically connected to the first redistribution layer 102. The encapsulant 112 is disposed on the first redistribution layer 102, and encapsulates the second semiconductor die 104 and the conductive vias 110. The second redistribution layer 114 is disposed on the encapsulant 112 and electrically connected to the conductive vias 110 and the first through-silicon via 104c in the second semiconductor die 104. The third semiconductor die 116 is disposed on the second redistribution layer 114 in a manner in which an active surface 116a is oriented toward the second redistribution layer 114, and the third semiconductor die 116 is electrically connected to the second redistribution layer 114 through a second through-silicon via 116c. The third redistribution layer 118 is disposed on the third semiconductor die 116 and electrically connected to the second through-silicon via 116c in the third semiconductor die 116.

In addition, in the semiconductor package 10, the first semiconductor die 100 and the third semiconductor die 116 have a relatively large size, and the second semiconductor die 104 has a relatively small size. In particular, at an overlooking angle from the third semiconductor die 116 to the first semiconductor die 100, an area of the second semiconductor die 104 is smaller than that of the first semiconductor die 100, and an area of the third semiconductor die 116 is larger than that of the second semiconductor die 104.

In the semiconductor package of the invention, elements are electrically connected to each other through the through-silicon vias, and an interposer is omitted, so that a speed at which an electrical signal is transmitted can be effectively improved. In addition, in the semiconductor package of the invention, the semiconductor die with a relatively large size and the semiconductor die with a relatively small size are alternately stacked, so that warpage caused by an uneven stress can be avoided. In addition, because an interposer is omitted and these semiconductor dies are alternately stacked, a size of the semiconductor package can be greatly reduced, thereby meeting a miniaturization requirement.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor package, comprising:
    a first semiconductor die comprising an active surface and a back surface that are opposite to each other;
    a first redistribution layer disposed on the active surface of the first semiconductor die and electrically connected to the first semiconductor die;
    a second semiconductor die comprising an active surface and a back surface that are opposite to each other and disposed on the first redistribution layer in a manner in which the active surface is oriented toward the first redistribution layer, wherein a plurality of first through-silicon vias are disposed in the second semiconductor die, and the second semiconductor die is electrically connected to the first redistribution layer through the plurality of first through-silicon vias;
    a plurality of conductive vias disposed on the first redistribution layer, located around the second semiconductor die, and electrically connected to the first redistribution layer;
    an encapsulant disposed on the first redistribution layer and encapsulating the second semiconductor die and the plurality of conductive vias;
    a second redistribution layer disposed on the encapsulant and electrically connected to the plurality of conductive vias and the plurality of first through-silicon vias in the second semiconductor die;
    a third semiconductor die comprising an active surface and a back surface that are opposite to each other and disposed on the second redistribution layer in a manner in which the active surface is oriented toward the second redistribution layer, wherein a plurality of second through-silicon vias are disposed in the third semiconductor die, and the third semiconductor die is electrically connected to the second redistribution layer through the plurality of second through-silicon vias; and
    a third redistribution layer disposed on the third semiconductor die and electrically connected to the plurality of second through-silicon vias in the third semiconductor die; wherein
    at an overlooking angle from the third semiconductor die to the first semiconductor die, an area of the second semiconductor die is smaller than that of the first semiconductor die, and an area of the third semiconductor die is larger than that of the second semiconductor die.

2. The semiconductor package according to claim 1, wherein the first semiconductor die and the third semiconductor die comprise a logic die.

3. The semiconductor package according to claim 1, wherein the second semiconductor die comprises a memory die or a controller die.

4. The semiconductor package according to claim 1, wherein the encapsulant exposes top surfaces of the plurality of first through-silicon vias in the second semiconductor die, the back surface of the second semiconductor die, and top surfaces of the plurality of conductive vias.

5. The semiconductor package according to claim 1, further comprising a plurality of solder balls disposed on the third redistribution layer and electrically connected to the third redistribution layer.

6. A semiconductor package manufacturing method, comprising:
    providing a first semiconductor die, wherein the first semiconductor die comprises an active surface and a back surface that are opposite to each other;
    forming a first redistribution layer on the active surface of the first semiconductor die, wherein the first redistribution layer is electrically connected to the first semiconductor die;
    stacking a second semiconductor die on the first redistribution layer, wherein the second semiconductor die comprises an active surface and a back surface that are opposite to each other, the active surface of the second semiconductor die is oriented toward the first redistribution layer, a plurality of first through-silicon vias are formed in the second semiconductor die, and the second semiconductor die is electrically connected to the first redistribution layer through the plurality of first through-silicon vias;
    forming a plurality of conductive vias on the first redistribution layer, wherein the plurality of conductive vias are located around the second semiconductor die and electrically connected to the first redistribution layer;
    forming an encapsulant on the first redistribution layer, wherein the encapsulant encapsulates the second semiconductor die and the plurality of conductive vias;
    forming a second redistribution layer on the encapsulant, wherein the second redistribution layer is electrically connected to the plurality of conductive vias and the plurality of first through-silicon vias in the second semiconductor die;
    stacking a third semiconductor die on the second redistribution layer, wherein the third semiconductor die comprises an active surface and a back surface that are opposite to each other, the active surface of the third semiconductor die is oriented toward the second redistribution layer, a plurality of second through-silicon vias are formed in the third semiconductor die, and the third semiconductor die is electrically connected to the second redistribution layer through the plurality of second through-silicon vias; and
    forming a third redistribution layer on the third semiconductor die, wherein the third redistribution layer is electrically connected to the plurality of second through-silicon vias in the third semiconductor die; wherein
    at an overlooking angle from the third semiconductor die to the first semiconductor die, an area of the second semiconductor die is smaller than that of the first semiconductor die, and an area of the third semiconductor die is larger than that of the second semiconductor die.

7. The semiconductor package manufacturing method according to claim 6, wherein the first semiconductor die and the third semiconductor die comprise a logic die.

8. The semiconductor package manufacturing method according to claim 6, wherein the second semiconductor die comprises a memory die or a controller die.

9. The semiconductor package manufacturing method according to claim 6, wherein the encapsulant exposes top surfaces of the plurality of first through-silicon vias in the second semiconductor die, the back surface of the second semiconductor die, and top surfaces of the plurality of conductive vias.

10. The semiconductor package manufacturing method according to claim 6, further comprising, after the third redistribution layer is formed: forming a plurality of solder balls on the third redistribution layer, wherein the plurality of solder balls are electrically connected to the third redistribution layer.

\* \* \* \* \*